United States Patent [19]

Igarashi

[11] Patent Number: 5,532,650
[45] Date of Patent: Jul. 2, 1996

[54] HIGH-FREQUENCY AMPLIFIER

[75] Inventor: Sadao Igarashi, Soma, Japan

[73] Assignee: Alps Electric Co., Ltd., Tokyo, Japan

[21] Appl. No.: 375,452

[22] Filed: Jan. 19, 1995

[30]   Foreign Application Priority Data

Jan. 20, 1994   [JP]   Japan .................. 6-021966

[51] Int. Cl.⁶ ........................................ H03F 3/16
[52] U.S. Cl. ................................ 330/300; 330/311
[58] Field of Search ................................ 330/289, 290, 330/300, 308, 311

[56]           References Cited

U.S. PATENT DOCUMENTS 4,174,503   11/1979   Merklinger et al. ............ 330/300
5,309,429    5/1994   Fukuda ............................ 370/29

FOREIGN PATENT DOCUMENTS 565380    8/1977   U.S.S.R. .................. 330/300

*Primary Examiner*—Steven Mottola
*Attorney, Agent, or Firm*—Guy W. Shoup; Patrick T. Bever

[57]           ABSTRACT

A high-frequency amplifier has a first signal amplifier which includes a field effect transistor, and a constant-current circuit which is direct current connected, as well as cascade-connected, to the field effect transistor for maintaining a constant drain current of the field effect transistor. This constant-current circuit also acts as a second amplifier. The constant-current circuit may comprise a bipolar transistor or temperature compensation circuit. In this high-frequency amplifier, its gain and noise figure are stable against ambient temperature changes and power consumption efficiency is improved. This high-frequency amplifier is also suitable for mass production.

7 Claims, 2 Drawing Sheets

HIGH-FREQUENCY AMPLIFIER

BACKGROUND OF THE INVENTION

1. Field of the Invention

The present invention relates to high-frequency amplifiers, and more particularly to a high-frequency amplifier having a gain and noise figure which are stable against ambient temperature changes and suitable for mass production with a high power-consumption efficiency.

2. Description of the Related Art

Conventionally, low-noise amplifiers have been used in the input circuit of the receiving section in communication equipment or the like. Since a field effect transistor (hereinafter called FET) using gallium arsenide has a superior noise figure, it has been used as an amplifier device suitable for creating a low-noise amplifier. Although an FET is very useful as an amplifier device, it is less easy-to-use than a bipolar transistor or other alternative devices when used in communication equipment, especially in a handy, portable unit such as a portable telephone. Such a drawback will be described later in detail by referring to drawings.

SUMMARY OF THE INVENTION

Accordingly, under the situations described above and to be described below, it is an object of the present invention to provide a high-frequency amplifier which is stable against changes in ambient temperature, which has a high power-consumption efficiency, and which is also suitable for mass production.

The foregoing object is achieved according to one aspect of the present invention through the provision of a high-frequency amplifier, comprising: a first signal amplifier comprising a field effect transistor; and a constant-current circuit which is direct current (DC) connected, as well as cascade-connected, to the field effect transistor for keeping constant the drain current of the field effect transistor and which also acts as a second signal amplifier amplifying the signal output from the first signal amplifier.

The foregoing object is also achieved according to another aspect of the present invention through the provision of a high-frequency amplifier, comprising: a first signal amplifier comprising a field effect transistor; and a constant-current circuit which is DC-connected and cascade-connected to the field effect transistor for keeping constant the drain current of the field effect transistor and which also acts as a second signal amplifier amplifying the signal output from the first signal amplifier; wherein the constant-current circuit is connected to the source of the field effect transistor.

The foregoing object is also achieved according to yet another aspect of the present invention through the provision of a high-frequency amplifier, comprising: a first signal amplifier comprising a field effect transistor; and a constant-current circuit which is DC-connected and cascade-connected to the field effect transistor for keeping constant the drain current of the field effect transistor and which also acts as a second signal amplifier amplifying the signal output from the first signal amplifier; wherein the constant-current circuit comprises a bipolar transistor.

The foregoing object is also achieved according to a further aspect of the present invention through the provision of a high-frequency amplifier, comprising: a first signal amplifier comprising a field effect transistor; and a constant-current circuit which is DC-connected and cascade-connected to the field effect transistor for keeping constant the drain current of the field effect transistor and which also acts as a second signal amplifier amplifying the signal output from the first signal amplifier; wherein the constant-current circuit includes a temperature compensation circuit.

The foregoing object is also achieved according to a yet further aspect of the present invention through the provision of a high-frequency amplifier, comprising: a first signal amplifier comprising a field effect transistor; and a constant-current circuit which is DC-connected and cascade-connected to the field effect transistor for keeping constant the drain current of the field effect transistor and which also acts as a second signal amplifier amplifying the signal output from the first signal amplifier; wherein the constant-current circuit includes a temperature compensation circuit which includes a diode.

According to each of the high-frequency amplifiers as constructed above, the drain current flowing through the FET becomes stable irrespective of changes in ambient temperature and device variance. Power to be consumed by the FET bias circuit can effectively be used for signal amplification.

BRIEF DESCRIPTION OF THE DRAWINGS

In the drawings, sections having the same function are denoted with the same reference numerals.

DESCRIPTION OF THE PREFERRED EMBODIMENTS

Before turning to the description of preferred embodiments, a detailed description will be given of the related art by referring to drawings.

Figure 2:
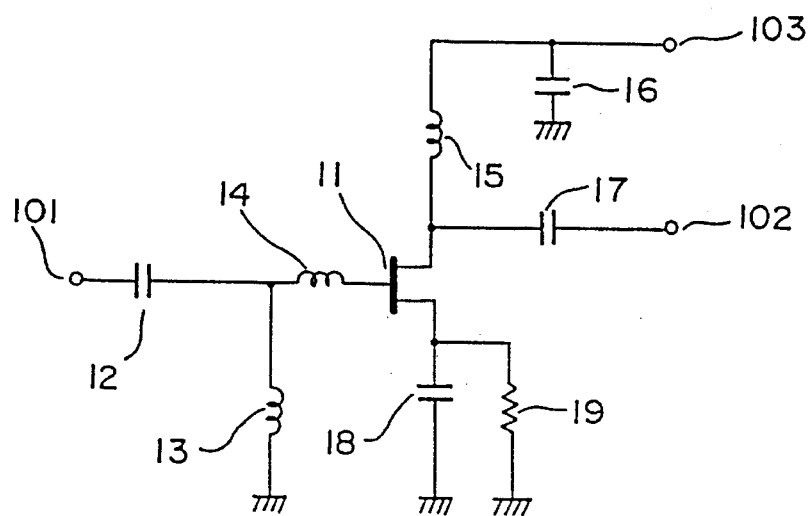
FIG. 2 is a circuit diagram illustrating the configuration of the high-frequency amplifier according to an embodiment using the conventional technique.

FIG. 2 illustrates an example of a high-frequency amplifier using an FET with the conventional technique. In FIG. 2, the amplifier comprises an FET 11, coupling capacitors 12 and 17, bypass capacitors 16 and 18, impedance-matching coils 13 and 14, a choke coil 15, a bias resistor 19, a signal input terminal 101, a signal output terminal 102, and a power terminal 103 to which a positive voltage is applied.

As shown in FIG. 2, the drain DC current flows through the bias resistor 19 to bias the source potential to a positive voltage. Since the gate is DC grounded through the coils 13 and 14, the gate potential is lower than the source potential. As a result, this FET operates with the gate negatively biased against the source. A high-frequency signal input to the signal input terminal 101 goes through a matching circuit consisting of the coils 13 and 14, and is low-noise amplified. Then, it flows through the coupling capacitor 17 and is output to the signal output terminal 102. If the gain is insufficient, a similar amplifier or a bipolar-transistor amplifier is cascade-connected to this amplifier circuit.

Figure 3:
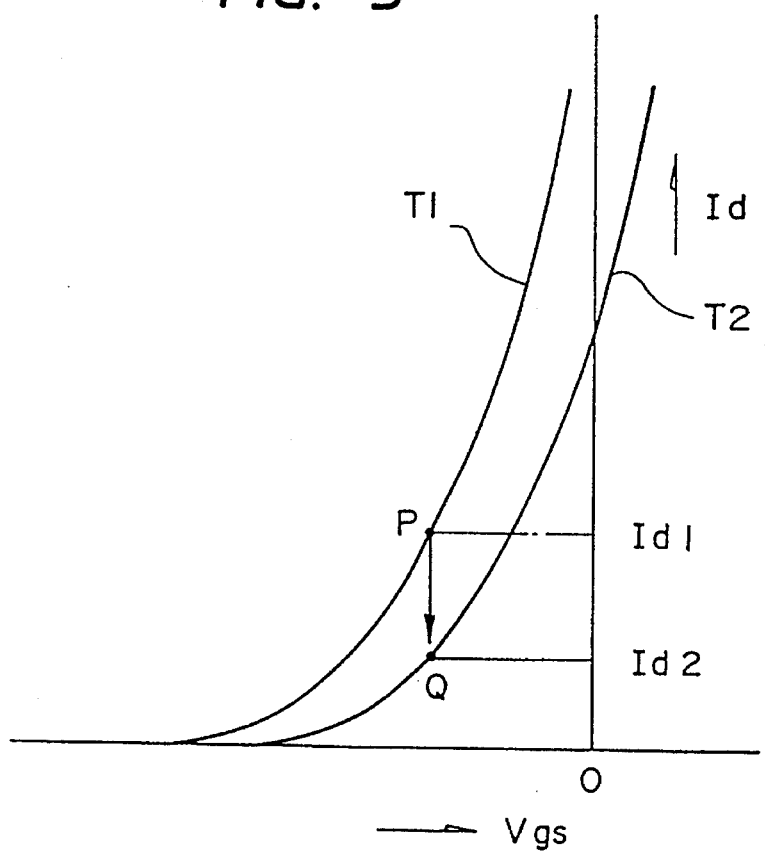
FIG. 3 illustrates the DC characteristics of a field effect transistor.

Referring to FIG. 3, the FET temperature characteristics will be described below. FIG. 3 shows a typical curve illustrating the gate voltage versus the drain current of an FET. The horizontal axis depicts the gate voltage (hereinafter sometimes called $V_{gs}$) relative to the source voltage, and the vertical axis depicts the drain current (hereinafter sometimes called $I_d$). The curve T1 indicates the characteristics of $V_{gs}$ versus $I_d$ at room temperature and the curve T2 indicates the characteristics of $V_{gs}$ versus $I_d$ at a high temperature. As shown in FIG. 3, the drain current $I_d$ decreases as the temperature rises. With a constant bias voltage applied as Vgs, the operating point shifts from point P to Q and the drain current decreases from $I_{d1}$ to $I_{d2}$ as the temperature rises. This state is equivalent to the condition that, in FIG. 2, a constant, negative bias voltage is applied to the gate using some means (not shown in FIG. 2) with the bias resistor 19 being set to have a resistance indefinitely close to zero.

According to FIG. 3, it is understood that a minute change of the drain current against a minute change of the gate voltage at point Q, Gm, is smaller than that at point P. When the bias resistor 19 becomes large in FIG. 2, a DC feedback also becomes large, slightly reducing the current change against the temperature. In this case, as will be described later, power consumed by the resistor 19 rises.

Figure 4:
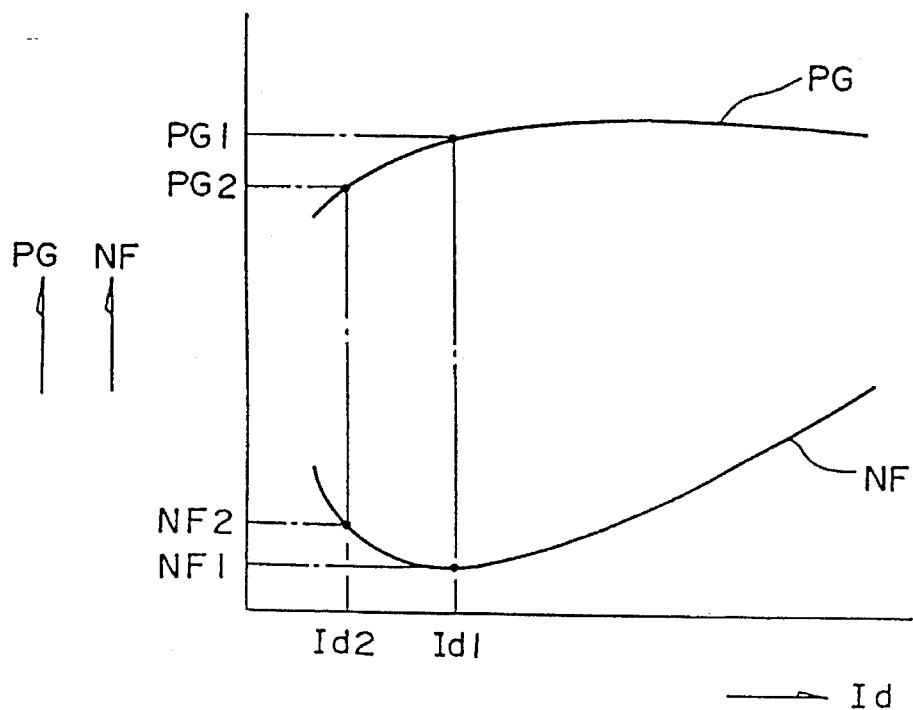
FIG. 4 illustrates the high-frequency characteristics of a field effect transistor.

Referring to FIG. 4, the relationship between the drain current and gain, and the drain current and noise figure, will be next described in detail. FIG. 4 illustrates curves for the drain current versus gain and for the drain current versus noise figure. The horizontal axis depicts the drain current $I_d$, and the vertical axis depicts the gain (hereinafter sometimes called PG) and noise figure (hereinafter sometimes called NF). As shown in FIG. 4, with a certain drain current, the gain is large and the noise figure is small. Such a direct current is the best drain current and corresponds to $I_{d1}$ in FIG. 4. If the drain current decreases from $I_{d1}$ to $I_{d2}$, the gain decreases from PG1 to PG2 and the noise figure increases from NF1 to NF2. Therefore, it will be understood that, in a high-frequency amplifier using an FET with the conventional technique, the gain decreases and the noise figure increases as the drain current decreases with an ambient temperature rise.

With the conventional technique, since the gate bias voltage is generated with the drain current flowing through the resistor 19, the power consumed by the resistor is just a heat loss and is not in any way used for signal amplification.

With the conventional technique, since the gate bias voltage is generated with the drain current flowing through the resistor 19, variations in the zero bias drain current of mass-produced FETs varies the operating point. This makes the variance of the characteristics of a high-frequency amplifier large. This is a problem in stably manufacturing high-frequency amplifiers conforming to the design specifications.

As described above in detail, the conventional technique has some drawbacks. First, as the ambient temperature rises, the amplification factor (gain) decreases and the noise figure rises, reducing sensitivity in receiving. Since a portable telephone or the like is often used outside in a wide range of temperatures and under more severe conditions than a unit secured and used at a fixed place, in received field intensity, preventing reduction in receive intensity has been one of the important technical issues.

A second drawback is that a negative bias voltage must be applied to the gate relative to the source for normal amplification. This causes a power loss at a resistor and increases the load for the power supply. In addition to the above-described resistor bias method, positive and negative dry cells can also be used for the negative bias. For portable telephones or similar equipment which feature handiness and portability, designing circuits which use power effectively and which can be driven by a single power supply (since lightweight is required), has also been one of the important technical issues.

A third drawback is that mass-produced FETs vary widely in zero-bias drain current. A high-frequency amplifier implemented with such a FET also has a wide variance in its gain and noise figure, preventing a high-frequency amplifier conforming to design specifications from being stably produced.

Referring to drawings, an embodiment of the present invention will be described below.

Figure 1:
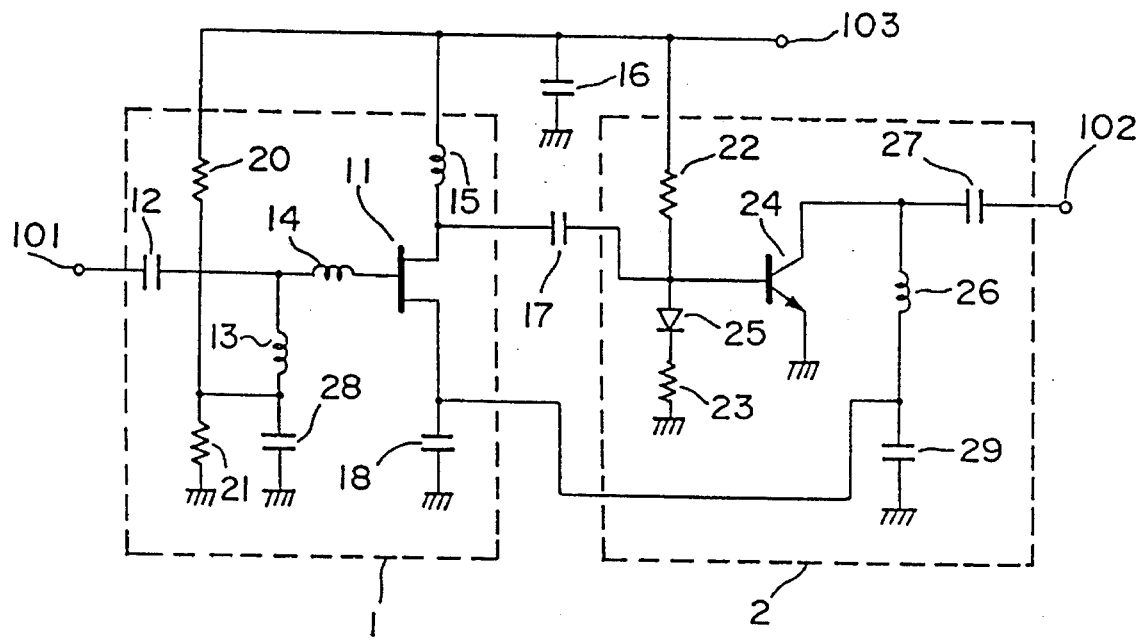
FIG. 1 is a circuit diagram illustrating the configuration of the high-frequency amplifier according to an embodiment of the present invention.

In FIG. 1, a high-frequency amplifier comprises: a first signal amplifier 1; a constant-current circuit 2 which also acts as a second signal amplifier; bias resistors 20 through 23; a bipolar transistor 24; a diode 25; a choke coil 26; a coupling capacitor 27; and bypass capacitors 28 and 29.

The operating point of this amplifier is determined as will be described below. The bias circuit consisting of the diode 25 and the resistors 22 and 23 determines the voltage applied to the base of the bipolar transistor 24, then the collector current of the transistor 24 is determined from its DC characteristics. Since the base junction voltage of the transistor 24 has a negative temperature coefficient, when a certain base bias voltage is applied to the base of the transistor 24, the collector current of the transistor 24 increases as the temperature rises. Since the junction voltage of the diode 25 also has a negative temperature coefficient, however, as the temperature rises, the divided voltage, which is applied to the base of the transistor 24, decreases, resulting in a certain constant collector current flowing through the transistor 24 regardless of changes in the ambient temperature. Since the transistor 24 cascade-connects to the FET 11 in direct current, the drain current flows through the FET 11, which is the same in quantity as the collector current of the transistor 24.

The bias resistors 20 and 21 determine the voltage applied to the gate of the FET 11, then its Source voltage is determined from the DC characteristics. Since the source of the FET 11 cascade-connects to the collector of the transistor 24 in direct current, the voltage which is the same as the source voltage of the FET 11 is applied to the collector of the transistor 24.

A high-frequency signal is input to the signal input terminal 101. The signal goes through the matching circuit, then is low-noise amplified by the FET 11. It then goes through the coupling capacitor 17, and is further amplified by the bipolar transistor 24. It then is output through the coupling capacitor 27 to the signal output terminal 102.

In the high-frequency amplifier constructed as described above, the drain current of the FET 11 is determined by the constant-current circuit 2. Even if the $I_{dss}$ characteristics of the FET 11 varies or the ambient temperature changes, a constant $I_d$ is always applied to the FET 11, thereby a stable gain and stable noise figure can be obtained. In this case, however, the source voltage of the FET and the collector voltage of the bipolar transistor 24 change accordingly. Since the main factors which determine the high-frequency characteristics of an FET and bipolar transistor are the drain current and the collector current, not the source voltage and collector voltage, these changes do not affect the object of the present invention.

In the configuration of an embodiment according to the present invention, the constant-current circuit which biases the FET also acts as the second high-frequency amplifier, increasing the efficiency of power consumption for the whole circuit.

As discussed hereinabove, the present invention provides a high-frequency amplifier having a gain and noise figure stable against ambient temperature changes and suitable for mass production with a high power-consumption efficiency.

What is claimed is:

1. A high-frequency amplifier, comprising:
   a first signal amplifier including a field effect transistor; and
   a constant-current circuit which is cascade-connected to said field effect transistor such that a constant drain current flows through said field effect transistor, said constant-current circuit also being connected to the field effect transistor such that the constant-current circuit acts as a second signal amplifier for amplifying a signal output from said first signal amplifier.

2. A high-frequency amplifier according to claim 1, wherein said constant-current circuit is connected to the source of said field effect transistor.

3. A high-frequency amplifier according to claim 1, wherein said constant-current circuit comprises a bipolar transistor having a base connected to a drain of the field effect transistor, a collector connected to a source of the field effect transistor, and an emitter connected to a reference voltage such that a drain current through the field effect transistor is equal to a collector current through the bipolar transistor.

4. A high-frequency amplifier according to claim 1, wherein said constant-current circuit comprises a temperature compensation circuit.

5. A high-frequency amplifier according to claim 4, wherein said temperature compensation circuit includes a diode.

6. A high-frequency amplifier, comprising:
   a first signal amplifier including a field effect transistor having a first terminal connected to a first voltage source through an impedance element, the field effect transistor also having a second terminal; and
   a constant-current circuit cascade-connected to the first signal amplifier, the constant-current source including a bipolar transistor having a base connected to the first terminal of the field effect transistor, a collector connected to the second terminal of the field effect transistor, and an emitter connected to a second voltage source;
   wherein a drain current through the field effect transistor is equal to a collector current through the bipolar transistor.

7. The high-frequency amplifier according to claim 6, wherein the constant-current circuit further comprises a first resistor connected between the first voltage source and the base of the bipolar transistor, a diode connected to the base of the bipolar transistor, and a second resistor connected between the diode and the second voltage source.

* * * * *